United States Patent [19]

Waters

[11] Patent Number: 5,764,123

[45] Date of Patent: Jun. 9, 1998

[54] TRANSFORMER WITH REDUCED SIGNAL RISE TIME

[75] Inventor: Christopher A. Waters, Redwood City, Calif.

[73] Assignee: Pearson Electronics, Inc., Palo Alto, Calif.

[21] Appl. No.: 255,051

[22] Filed: Jun. 7, 1994

[51] Int. Cl.$^6$ .............................. H01F 27/36; H01F 27/28
[52] U.S. Cl. ..................... 336/84 R; 336/84 C; 336/170
[58] Field of Search ................................ 336/84 R, 84 C, 336/170

[56] References Cited

U.S. PATENT DOCUMENTS

| | | | |
|---|---|---|---|
| 3,146,417 | 8/1964 | Pearson | 336/69 |
| 5,216,356 | 6/1993 | Owen | 336/84 C |

*Primary Examiner*—Michael L. Gellner
*Assistant Examiner*—Daniel Chapik
*Attorney, Agent, or Firm*—Flehr Hohbach Test Albritton & Herbert LLP

[57] ABSTRACT

A current transformer for monitoring a current in a conductor. The current transformer comprises a winding assembly that includes a resistive load. The transformer further comprises a compensation circuit that has an impedance selected to reduce output signal overshoot across the output terminals of the current transformer caused by the intrinsic inductance of the resistive load. The transformer also comprises a small gauge semi-rigid coaxial cable to reduce a loop pickup area formed by the conductive paths that connect the winding assembly terminals of the winding assembly and the output terminals of the current transformer. This results in output signal overshoot across the output terminals being further reduced. Additionally, the transformer comprises a transformer shield that encloses the winding assembly and has end portions that do not contact each other to define a gap that prevents the transformer shield from acting as a shorted turn. The end portions overlap each other so as to reduce penetration of stray magnetic flux through the gap and further reduce output signal overshoot. All of the transformer shield is spaced from the winding assembly and the transformer shield does not enclose another transformer shield. This reduces stray capacitances between the transformer shield and the winding assembly so that the frequency response of the current transformer is flattened and ringing in the output signal is reduced.

11 Claims, 10 Drawing Sheets

TRANSFORMER WITH REDUCED SIGNAL RISE TIME

The present invention relates generally to transformers. Specifically, it relates to a transformer for monitoring pulse and/or alternating currents which has a reduced output signal rise time.

BACKGROUND OF THE INVENTION

In the prior art current monitoring transformers, the useable rise-time of the output signal of the transformer is typically large. For example, in the case of a transformer with a 2 inch hole diameter, this rise time is at best approximately 20 nanoseconds. Thus, the prior art transformers cannot accurately monitor current pulses of shorter rise-time than 20 nanoseconds or alternating currents with frequencies above 20 megahertz.

The reason that the useable rise-time of the output signal of these transformers is rather large is that significant output signal overshoot (i.e., the maximum positive value of the output signal minus the final output signal value) and ringing in the output signal (i.e., oscillation in the output signal) typically occurs. In the case of a transformer with a 2 inch hole diameter, overshoot of approximately 10% is typical while ringing amplitude of approximately 5% is typical when viewing a current pulse with 20 nanosecond rise-time. This is due to several factors.

First, some prior art transformers, such as the one described in expired U.S. Pat. No. 3,146,417, which is hereby expressly incorporated by reference, have a winding assembly that includes a winding, a terminating resistive load, and a terminating planar conductor both formed along the length of the core. Taps connect the winding and the resistive load at roughly equidistant points on the winding so that the resistive load is distributed.

Since the resistive load traverses the length of the core, it has a rather large intrinsic inductance (or inductance per unit length). The taps of the resistive load distribute the intrinsic inductance among the small transformer sections. Thus, a voltage can be induced across each of the distributed intrinsic inductances which can result in large output signal overshoot across the output terminals of the transformer.

Second, the prior art transformers include a shield where the edges of the end portions of the shield that form a gap in the shield do not overlap. As a result, current in the conductor or circuit being monitored which does not flow perpendicular to the sides of the transformer may result in magnetic flux within the shield that penetrates through the gap. This type of magnetic flux is non-circumferential within the transformer shield and is therefore considered stray magnetic flux.

The non-circumferential stray magnetic flux is undesirable since the conductive paths that connect the winding assembly to the output terminals partially enclose and define a loop pickup area through which magnetic flux can pass. Thus, when a rapid change in stray non-circumferential magnetic flux that passes through the loop pickup area occurs, a voltage spike is induced due to the mutual inductance of the pickup loop with the conductor or circuit being monitored. This voltage spike is seen as output signal overshoot across the output terminals of the transformer.

Third, the conductive paths of the prior art transformers may include the widely spaced apart inner and outer conductors of a large gauge flexible coaxial cable, lengthy, widely spaced apart, and unshielded conductive elements including wires and resistors, and any combination thereof. Thus, the loop pickup area that the conductive paths enclose is large. As a result, a significant voltage spike across the output terminals of the transformer will be induced when a rapidly changing magnetic flux passes through this loop pickup area thereby also resulting in output signal overshoot across the output terminals of the transformer.

Fourth, in the prior art transformers, the transformer shield is adjacent the winding assembly in order to make the transformer as compact as possible. However, this results in large capacitances being developed between the transformer shield and the core, winding, resistive load, and/or planar conductor of the winding assembly. These capacitances affect the performance of the transformer in that they cause significant ringing of the output signal (i.e., oscillation) of the transformer in response to fast-rising pulses in the current being monitored by the transformer.

SUMMARY OF THE INVENTION

The foregoing problems are cured by a transformer that comprises a winding assembly that includes a signal terminal and a return terminal, a winding, and a resistive load. The winding has a first end connected to the signal terminal of the winding assembly and has a second end. The resistive load has a first end connected to the signal terminal of the winding assembly and has a second end connected to the second end of the winding. The resistive load has a resistance and an intrinsic inductance effectively in series with the resistance.

The transformer also comprises a coaxial cable that includes an inner conductor having a first end proximate to and connected to the output signal terminal of the winding assembly and a second end coupled to the output signal terminal. The coaxial cable also includes an outer conductor surrounding substantially most of the inner conductor and having a first end proximate to and coupled to the return terminal of the winding assembly and a second end coupled to the return terminal.

The transformer further comprises an overshoot compensation circuit that is coupled between the output signal and output return terminals. It has an impedance sufficient to reduce output signal overshoot across the output signal and output return terminals caused by the intrinsic inductance of the resistive load of the winding assembly.

In addition, the transformer comprises a transformer shield that encloses the winding assembly but does not enclose another transformer shield. The transformer shield has end portions that overlap and all of the transformer shield is spaced from the winding assembly.

BRIEF DESCRIPTION OF THE DRAWINGS

The invention will be more readily apparent from the following detailed description and appended claims when taken in conjunction with the drawings, in which:

DETAILED DESCRIPTION OF THE INVENTION

Figure 1:
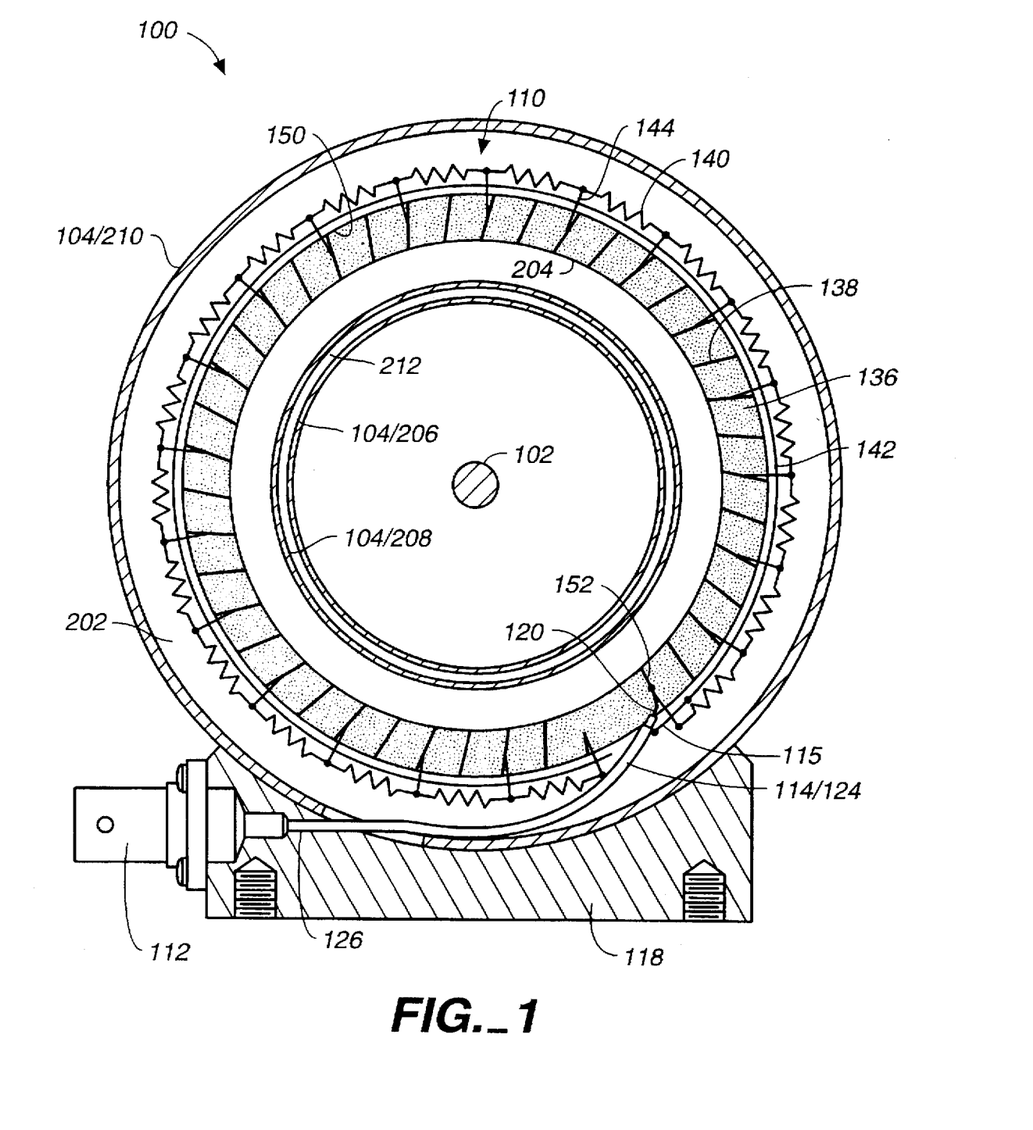
FIG. 1 is a schematic view of a transformer in accordance with the present invention.

Referring to FIG. 1, there is shown a schematic view of a transformer 100 for monitoring pulse and/or alternating currents in a conductor 102. As is known by those skilled in the art, a change in the current of the conductor 102 results in a changing magnetic flux within the transformer shield 104. In response, a voltage is induced across the terminals 106 and 108 of the winding assembly 110 which is generally proportional to and generally has the same frequency and phase as the current of the conductor 102. This voltage is supplied to the coaxial connector 112 by the coaxial cable 114 and is output by the coaxial connector 112 as the output signal of the transformer 100.

Figure 3:
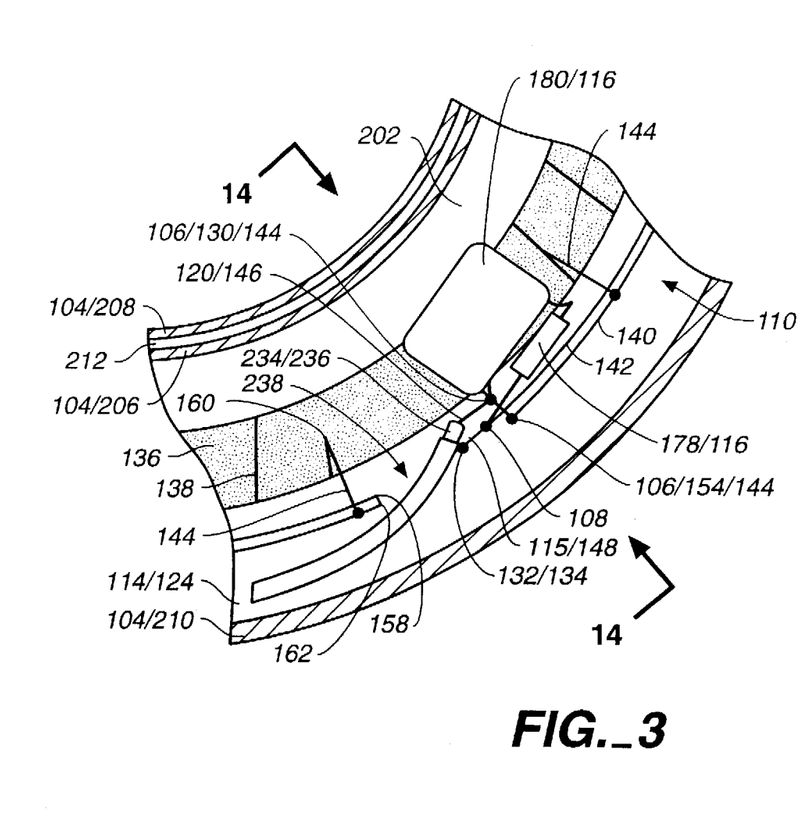
FIG. 3 is a close up view of the winding assembly terminal area of the transformer of FIG. 1.

As shown in FIG. 1, transformer 100 includes the winding assembly 110, the coaxial cable 114, the conductive wire 115, the coaxial connector 112, the toroid shaped transformer shield 104, and a support base 118. Moreover, as shown in FIG. 3, transformer 100 includes an overshoot compensation circuit 116. The compensation circuit 116 is not shown in FIG. 1 for purposes of clarity.

The support base 118 of transformer 100 is fixed to the transformer shield 104. The coaxial connector 112 is fixed to the support base 118 and connected to the coaxial cable 114 within the support base 118. The coaxial cable 114 runs through the support base 118 and into the transformer shield 104.

Figure 2:
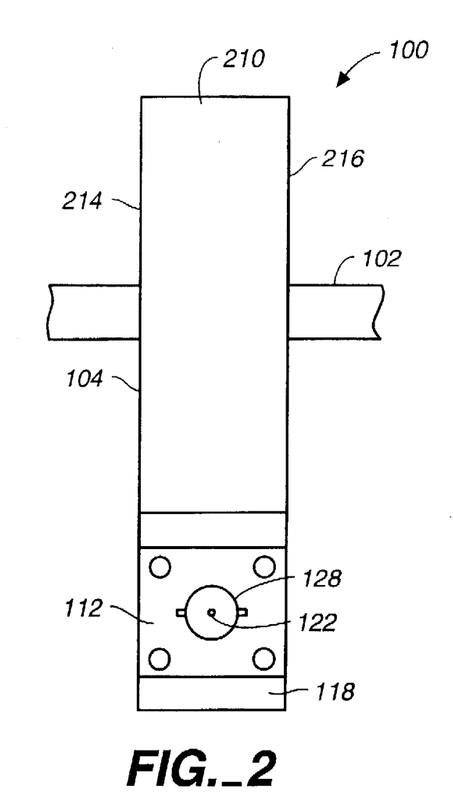
FIG. 2 provides an external front view of the transformer of FIG. 1.

Referring to both FIGS. 1 and 2, the end of the inner conductor 120 of the coaxial cable 114 which is not shown is connected to the output signal terminal (i.e., inner connector member) 122 of the coaxial connector 112. The end 126 of the outer conductor 124 of the coaxial cable 114 is connected to the output return terminal (i.e., outer connector body) 128 of the coaxial connector 112.

Referring to FIGS. 1 and 3, the unshielded end 130 of the inner conductor 120 (which is not surrounded by the outer conductor 124 of the coaxial cable 114) is connected to the signal terminal 106 of the winding assembly 110. The end 132 of the outer conductor 124 is connected to the first end 134 of the conductive wire 115. The second end 136 of the conductive wire 115 is connected to the return terminal 108 of the winding assembly 110.

Thus, the inner conductor 120 serves as a conductive output signal path that connects the output signal terminal 122 of the transformer 100 and the signal terminal 106 of the winding assembly 110. And, the outer conductor 124 and the conductive wire 115 together serve as a conductive return signal path that connects the output return terminal 128 of the transformer 100 and the return terminal 108 of the winding assembly 110.

The winding assembly 110 includes a toroid shaped core 136, a mostly toroid shaped winding 138, a terminating resistive load 140, a terminating planar conductor 142, a number of resistive taps 144, and the terminals 106 and 108. Formed over substantially most of the core 136 is the winding 138 and formed along substantially most of the outer circumference or length 150 of the core 136 are the resistive load 140, and the planar conductor 142. The winding 138 and resistive load 140 are connected by the resistive taps 144 at various points along the outer circumference 150 of the core 136.

Referring again to FIGS. 1 and 3, the signal terminal 106 of the winding assembly 110 is connected to the first end 152 of the winding 138 and the first end 154 of the resistive load 140. The return terminal 108 of the winding assembly 110 is connected to the first end 156 of the planar conductor 142. The second end 158 of the planar conductor 142 is connected to the second end 160 of the winding 138 and the second end 162 of the resistive load 140.

Figure 4:
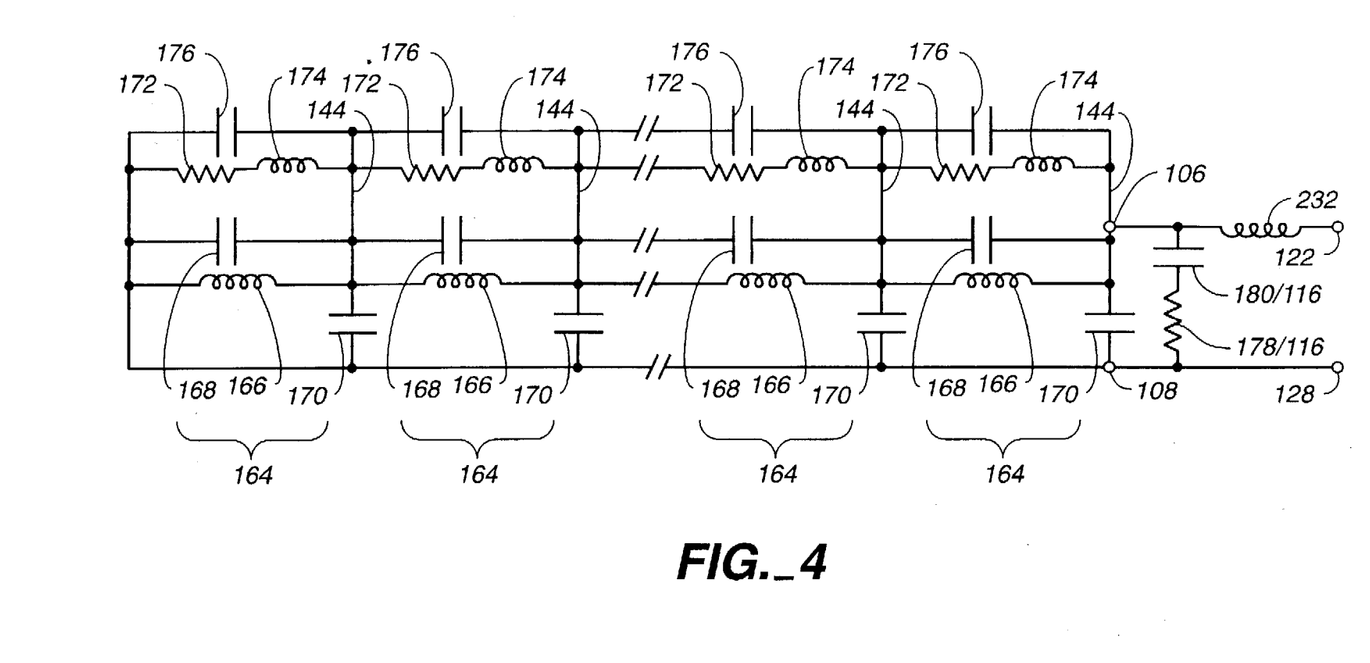
FIG. 4 provides an equivalent circuit for the transformer of FIG. 1.

As described in expired U.S. Pat. No. 3,146,417, the foregoing construction of transformer 100 makes the resistive load 140 distributed. As shown in FIG. 4, the resulting equivalent circuit for transformer 100 comprises a number of serially connected small transformer sections 164 located between each tap 144.

Each of the small transformer sections 164 includes a transformer section inductance 166. The transformer section inductances 166 are the distributed inductances between the taps 144 which are due to the winding 138.

Each of the small transformer sections 164 also includes the transformer section capacitances 168 and 170. The transformer section capacitance 168 is the capacitance from the electric coupling between the turns of the winding 138 in the transformer section 164 (i.e., the capacitance between two taps 144). The transformer section capacitance 170 is the capacitance from the electric coupling of the winding 138 and the resistive load 140 to the core 136, the transformer shield 104, and the planar conductor 142.

Each of the small transformer sections 164 further includes a transformer section resistance 172. The transformer section resistances 172 are the distributed portions of the resistive load 140 between each tap 144.

Furthermore, since the resistive load 140 traverses along approximately the outer circumference 150 of core 136, it has an intrinsic inductance (or inductance per unit length) and an intrinsic capacitance (or capacitance per unit length) associated with it. Although the intrinsic inductance is reduced by use of the planar conductor 142 (in that the resistive load 140 and planar conductor 142 together comprise a transmission line) a significant amount of the intrinsic inductance still remains which affects performance of the transformer 100, as will be discussed shortly.

Thus, associated with each of the transformer section resistances 172 is a transformer section intrinsic inductance 174 and a transformer section intrinsic capacitance 176. The transformer section intrinsic inductance 174 is connected effectively in series with the transformer section resistance 170 and the transformer intrinsic capacitance 176 is effectively connected in parallel with the series connection of the transformer section resistance 170 and transformer section intrinsic inductance 174. Therefore, in response to a rapid change in the current of conductor 102, such as the fast-rising edge of a pulse signal, a voltage spike is induced across each of the transformer section intrinsic inductances 174 which results in output signal overshoot across the output terminals 122 and 128 of the transformer 100.

Referring to both FIGS. 1, 3, and 4, in order to reduce this output signal overshoot, the transformer 100 includes the compensation circuit 116. The compensation circuit 116 has an impedance that is selected to compensate for, offset, and reduce the output signal overshoot due to the intrinsic inductance of the resistive load 140.

The compensation circuit 116 includes a resistor 178 and a capacitor 180 connected in series between the signal and return terminals 106 and 108 of the winding assembly 110. The series connection of the resistance of the resistor 178 and the capacitance of the capacitor 180 form the impedance of the compensation circuit 116. The resistance of the resistor 178 and the capacitance of the capacitor 180 are determined and selected as follows.

Figure 5:
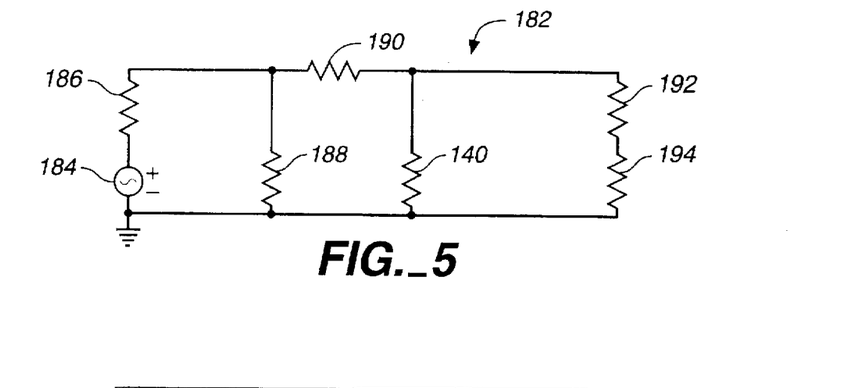
FIG. 5 is a test circuit used in determining the impedance of the overshoot compensation circuit of the transformer of FIG. 1.

First, the resistive load 140 is connected as shown in FIG. 5 in the test circuit 182. The test circuit 182 includes the resistive load 140, the adjustable rise-time current step generator 184, the 50 ohm resistor 186, the 55 ohm resistor 188, the 470 ohm resistor 190, the 19.5 ohm resistor 192, and the 31.5 ohm resistor 194.

Figure 6:
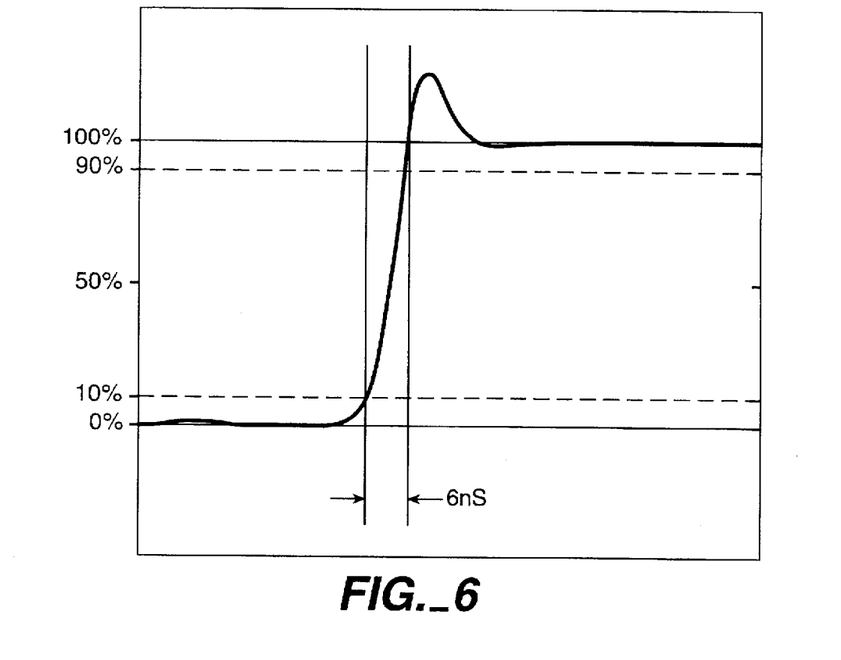
FIG. 6 is an observed and recorded time domain response of the test circuit of FIG. 5.
Figure 7:
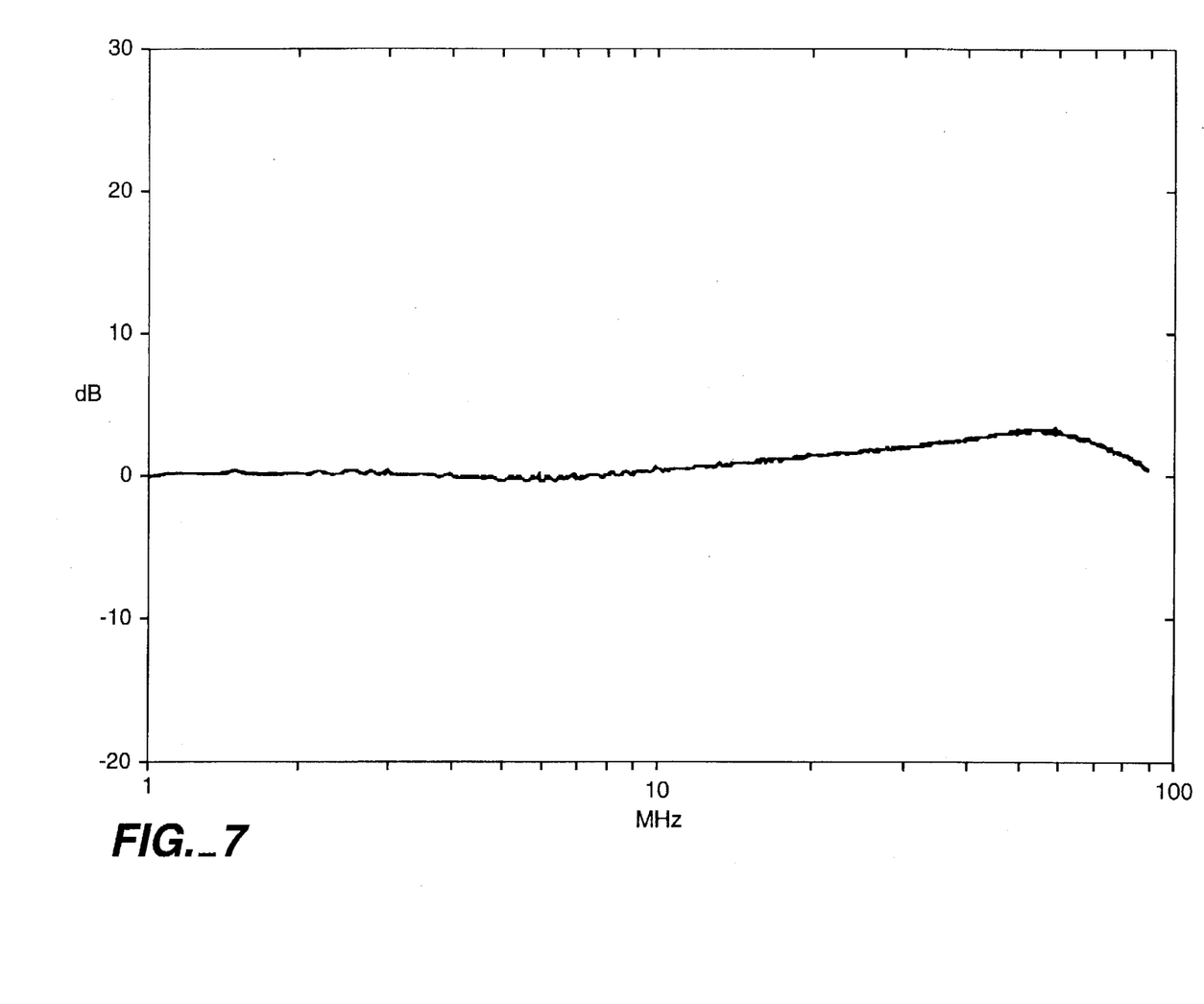
FIG. 7 is an observed and recorded frequency domain response of the test circuit of FIG. 5.

In response to a current step generated by the current step generator 184, a voltage is developed across the resistive load 140. This voltage is observed and recorded in the time domain, as shown in FIG. 6, with an oscilloscope and in the frequency domain, as shown in FIG. 7, with a spectrum analyzer.

Figure 8:
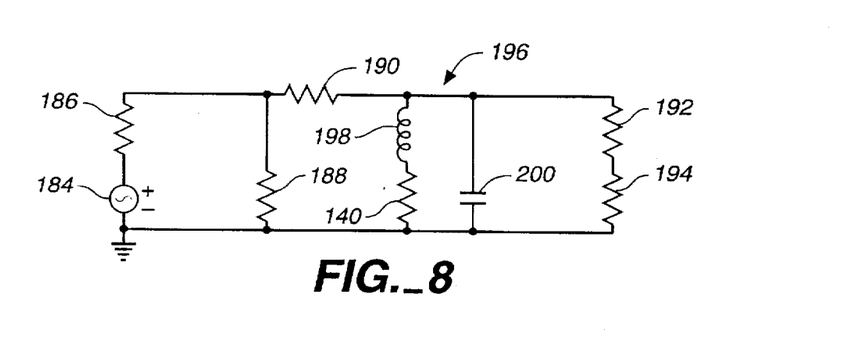
FIG. 8 is the equivalent circuit for the test circuit of FIG. 5.

FIG. 8 shows the equivalent circuit 196 for the test circuit 182. The equivalent circuit 196 takes into account the intrinsic inductance 198 and intrinsic capacitance 200 of the resistive load 140. Thus, the intrinsic inductance 198 is connected in series with the resistive load 140 while the intrinsic capacitance 200 is connected in parallel to the series connection of the intrinsic inductance 198 and resistive load 140.

Figure 9:
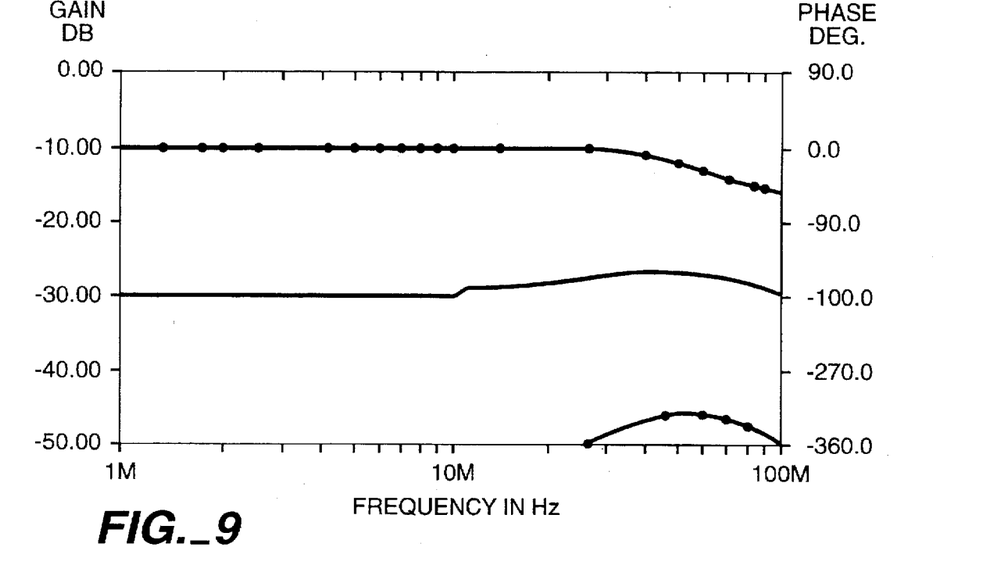
FIG. 9 is the modeled frequency response of the equivalent circuit of FIG. 8.
Figure 10:
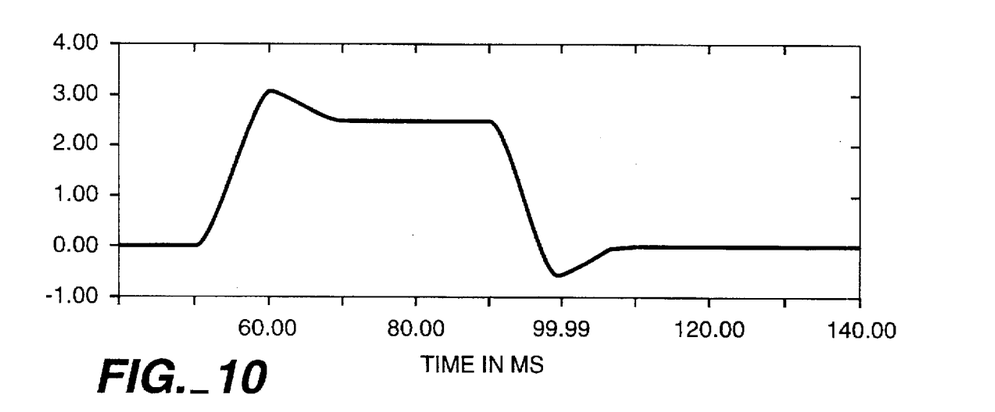
FIG. 10 is the modeled time domain response of the equivalent circuit of FIG. 8.

The equivalent circuit 196 is modeled with a commercially available computer program called MICROCAP by Spectrum Software, Inc. and Addison Wesley Publishing Co. The model values for the resistance of the resistive load 140, the intrinsic inductance 198, and the intrinsic capacitance 200 are varied by the user of the MICROCAP program until the model frequency response, shown in FIG. 9, and the model time domain response, shown in FIG. 10, for the equivalent circuit 196 match as close as possible the observed and recorded frequency response, shown in FIG. 6, and time domain response, shown in FIG. 7, for the test circuit 182.

Figure 11:
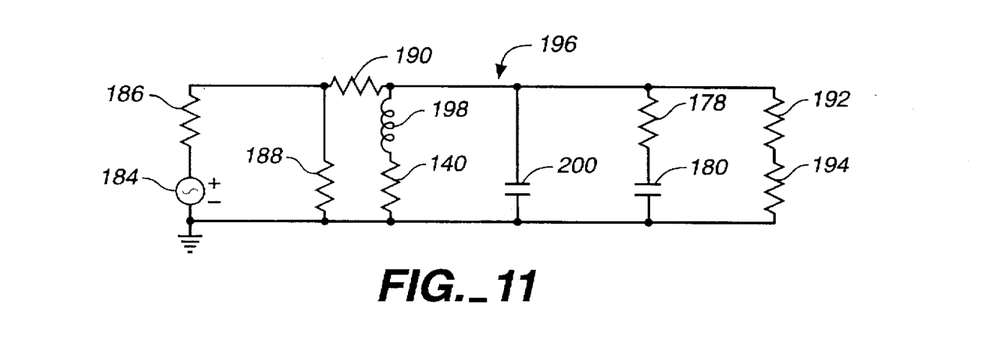
FIG. 11 is the equivalent circuit of FIG. 8 with an added compensation circuit.
Figure 12:
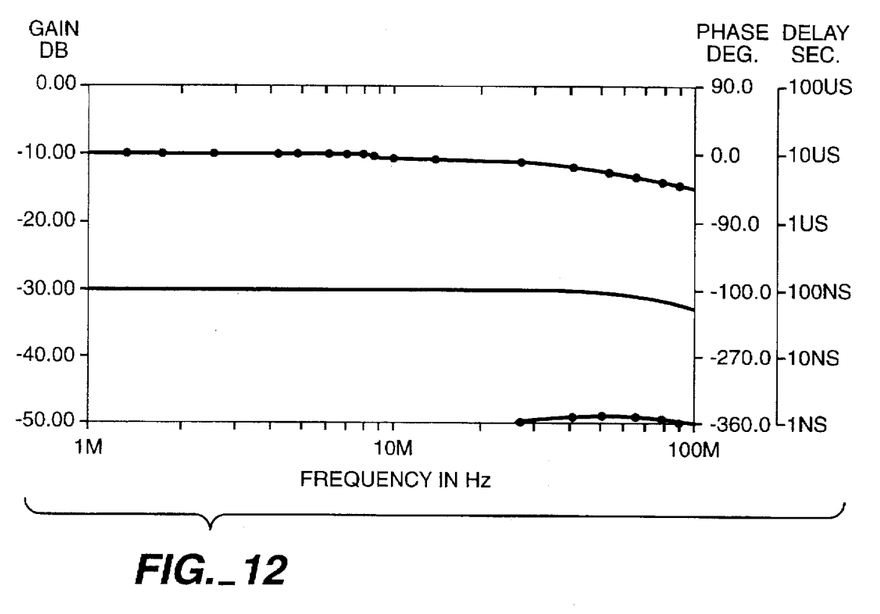
FIG. 12 is the modeled frequency response of the equivalent circuit of FIG. 11 with the flattest response.
Figure 13:
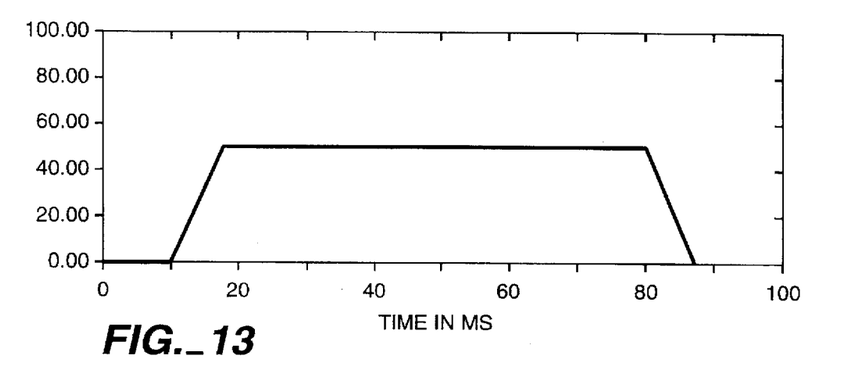
FIG. 13 is the modeled time domain response of the equivalent circuit of FIG. 11 with the least output signal overshoot.

The compensation circuit 116 is then added to the model for the equivalent circuit 196, as shown in FIG. 11. The model values for the resistance of the resistive load 140, the intrinsic inductance 198, and the intrinsic capacitance 200 which resulted in the closest match are kept fixed while the user of the MICROCAP program varies the model values for the resistance of the resistor 178 and the capacitance of the capacitor 180. This is done until the flattest model frequency response, shown in FIG. 12, and the least output signal overshoot in the model time domain response, shown in FIG. 13, is obtained by the MICROCAP program. The model values of the resistance of the resistor 178 and the capacitance of the capacitor 180 for which this occurs are then the actual values selected for use in the compensation circuit 116.

As described earlier, in the preferred embodiment, the compensation circuit 116 includes the resistor 178 in series with the capacitor 180. But, in the simplest case, the compensation circuit 116 could simply include the capacitor 180. Referring to FIG. 7, this would to roll off the frequency response and get rid of the broad high frequency peak. However, in order to reduce the effects of the capacitor 180 at frequencies above the broad high frequency peak the resistor 178 is employed.

Moreover, in the preferred embodiment, the resistor 178 and capacitor 180 of the compensation circuit 116 are discrete components inside transformer shield 104 which are connected in series between the signal and return terminals 106 and 108 of the winding assembly 110, as shown in FIG. 3. However, like the resistive load 140, the resistor 178 and capacitor 180 may be formed along the core 136 of the transformer 100. Also, the compensation circuit 116 may be connected across the terminals 122 and 128 of transformer 100 external to the transformer shield 104. For a transformer with the dimensions described herein for the preferred embodiment, a typical resistance for resistor 178 would be in the range 60–80 ohms and a typical capacitance for capacitor 180 would be in the range 50–100 pF.

Figure 14:
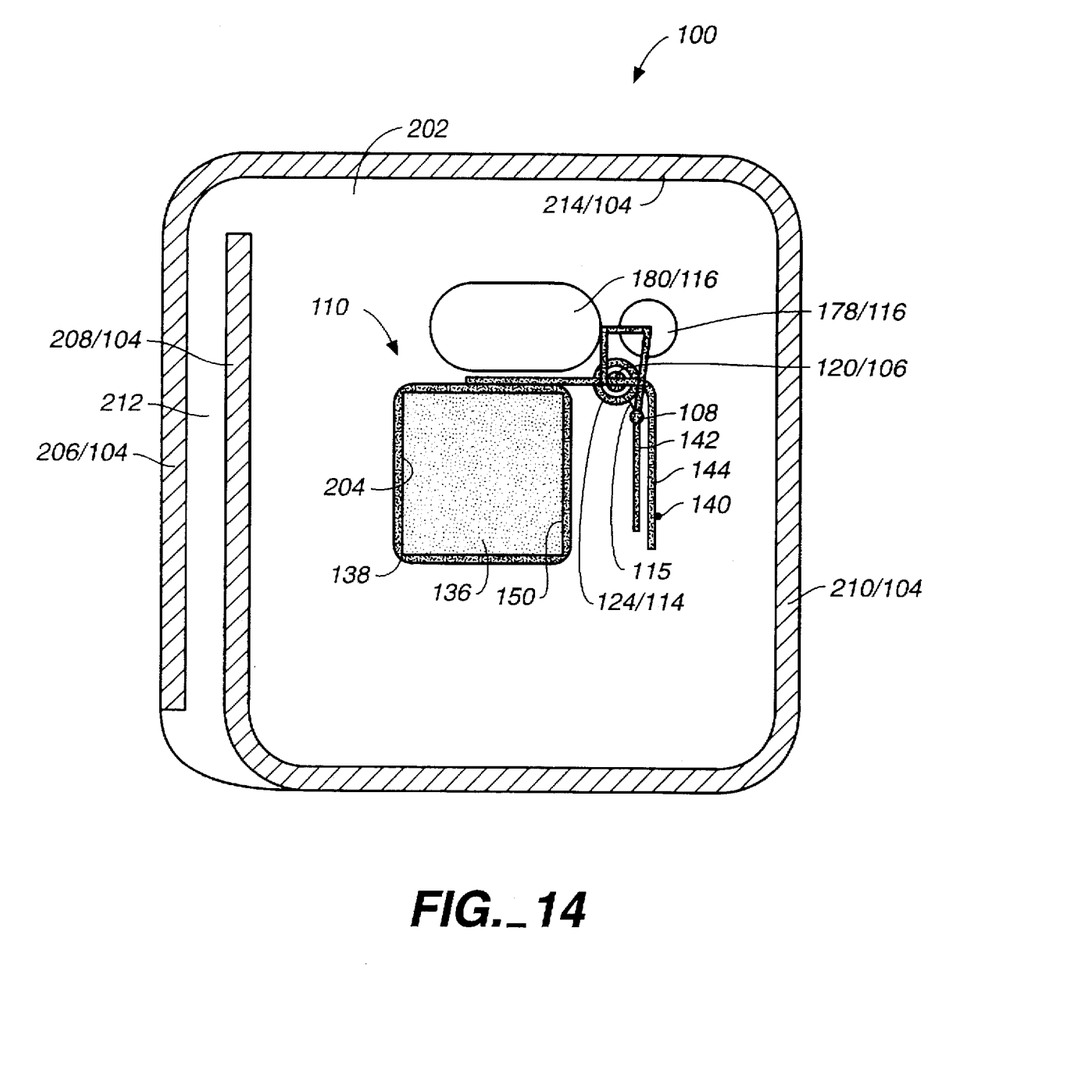
FIG. 14 provides a cross sectional view of the transformer of FIGS. 1 and 3 taken along the line 14—14 of FIG. 3.

FIG. 14 shows a cross sectional view of the transformer 100. This cross sectional view is in the area shown by FIG. 3.

Around the magnetic core 136 is formed the winding 138. Spaced from and traveling substantially most of the outer circumference 150 of the core 136 are the planar conductor 142 and the resistive load wire 140. The resistive load wire 140 is adjacent to and travels parallel to the planar conductor 142. The tap 144 connects the resistive load wire 140 to the winding 138. The epoxy filler or dielectric material 202 fills the spaces of the winding assembly 110. This construction of the winding assembly 110 is similar to that described in expired U.S. Pat. No. 3,146,417, except that in the present invention, as shown in FIG. 1, the planar conductor 142 and the resistive load 140 are formed along substantially most of the outer circumference 150 of the core 136 rather than its inner circumference 204.

In the preferred embodiment, the core 136 has a cross section of approximately 0.25 inches by 0.25 inches and the outer and inner circumferences 150 and 204 of the core 136 are approximately 10.2 inches and 8.6 inches. Moreover, the planar conductor 142 and the resistive load wire 140 are spaced approximately 0.12 inches from the outer circumference 150 of the core 136. The resistive load 140 has a resistance of approximately 50 ohms and the winding 138 has approximately 40 turns.

The compensation circuit 116 lies above the winding assembly 110. Specifically, the capacitor 180 of the compensation circuit 116 lies over the core 136 and the winding 138 and is connected to the tap 144 and the resistor 178 of the compensation circuit 116 to form the signal terminal 106 of the winding assembly 110. The resistor 178 lies over the planar conductor 142 and the resistive load wire 140 and is connected to the planar conductor 142 to form the return terminal 108 of the winding assembly 110.

The transformer shield 104 encloses the winding assembly 110, the conductive wire 115, the resistor 178, and the capacitor 180. The remaining space within the transformer shield 104 is filled with the epoxy filler or dielectric material 202.

Transformer shield 104 includes two circumferential inner end walls or portions 206 and 208, a circumstantial outer wall or portion 210, and two side walls or portions 214 and 216. The inner end walls 206 and 208 are integrally joined to the side walls 214 and 216 respectively while the side walls 214 and 216 are each joined to the outer wall 210. The two inner end walls 206 and 208 overlap over a substantial length, are spaced apart over this length, and do not contact each other so as to define an elongated or deep insulating gap 212 that is circumferential.

In the preferred embodiment, with transformer shield 104 has a cross section of approximately 1 inch by 1 inch. The inner walls 206 and 208 are spaced approximately 0.030 inches apart and overlap by approximately 0.70 inches. Thus, in the preferred embodiment the gap 212 has a width of 0.030 inches and a length of approximately 0.70 inches.

Figure 15:
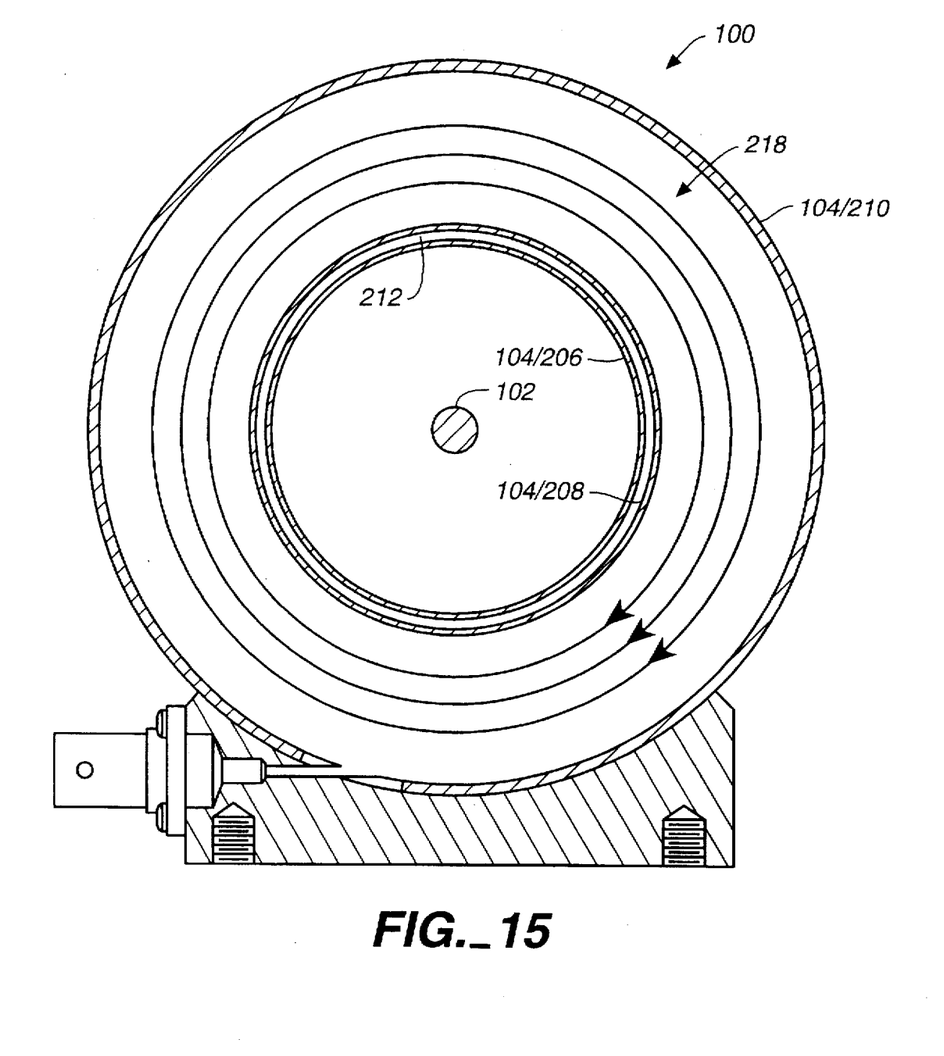
FIG. 15 shows penetration of circumferential magnetic flux within the transformer shield of the transformer of FIG. 1.

As shown in FIG. 15, the transformer shield 104 is toroid shaped to allow penetration of circumferential magnetic flux 218 within the transformer shield 104. Such circumferential magnetic flux 218 occurs at points where the current of the conductor 102 under test flows perpendicular to the side walls 214 and 216 (shown in FIG. 16) of the transformer shield 104. The gap 212 prevents the transformer shield 104 from acting as a shorted turn with currents induced by changes in the circumferential magnetic flux 218 which would create an opposing magnetic flux that would effectively cancel the circumferential magnetic flux 218.

Figure 16:
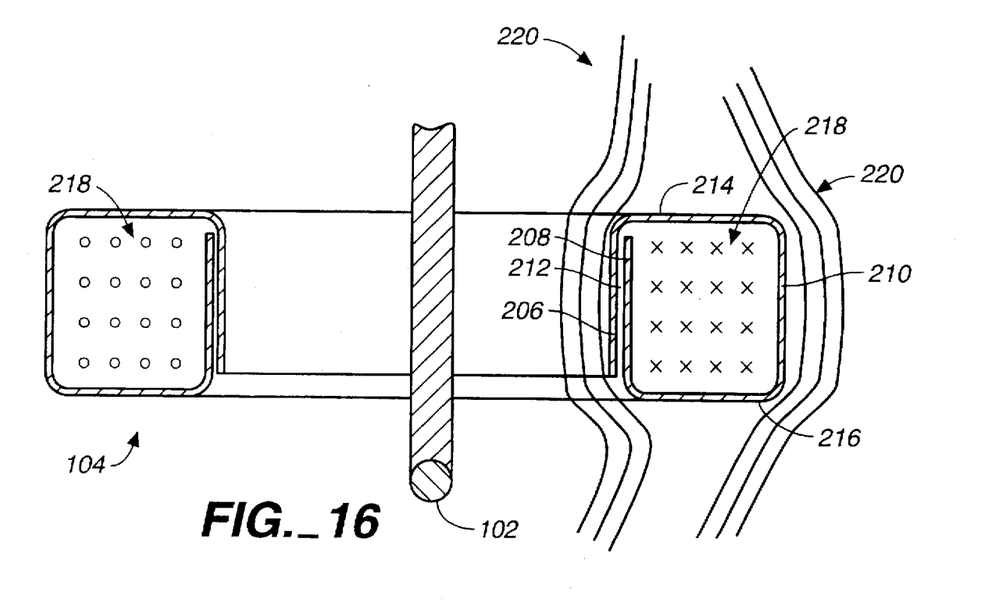
FIG. 16 shows reduction of penetration of stray magnetic flux through the elongated insulating gap of the transformer shield of FIG. 15 that is not circumferential within the transformer shield.

Moreover, as shown in FIG. 16, the elongated insulating gap 212 of transformer shield 104 reduces or insulates against penetration of stray magnetic flux 220 that is not circumferential within the transformer shield 104. Such non-circumferential stray magnetic flux 220 occurs at points where the conductor 102 under test is bent (out of the page) towards one of the side walls 214 or 216 of the transformer shield 104 and the current does not flow perpendicular to the side walls 214 and 216 of the transformer shield 104.

In this situation, circumferential currents perpendicular to the stray magnetic flux 220 are induced in the outer wall 210 and the inner walls 206 and 208 of the transformer shield 104 by changes in the stray magnetic flux 220. This creates an opposing magnetic flux within the transformer shield 104 that effectively cancels the stray magnetic flux 220. This cancellation occurs even in the elongated gap 212 since the length of the gap 212 (due to the overlapping inner walls 206 and 208) is substantially greater than its width. In other words, enough currents will be induced over the length of the gap 212 in the overlapping inner walls 206 and 208 to create an opposing magnetic flux that offsets the stray magnetic flux 220 in the gap 212.

Figure 17:
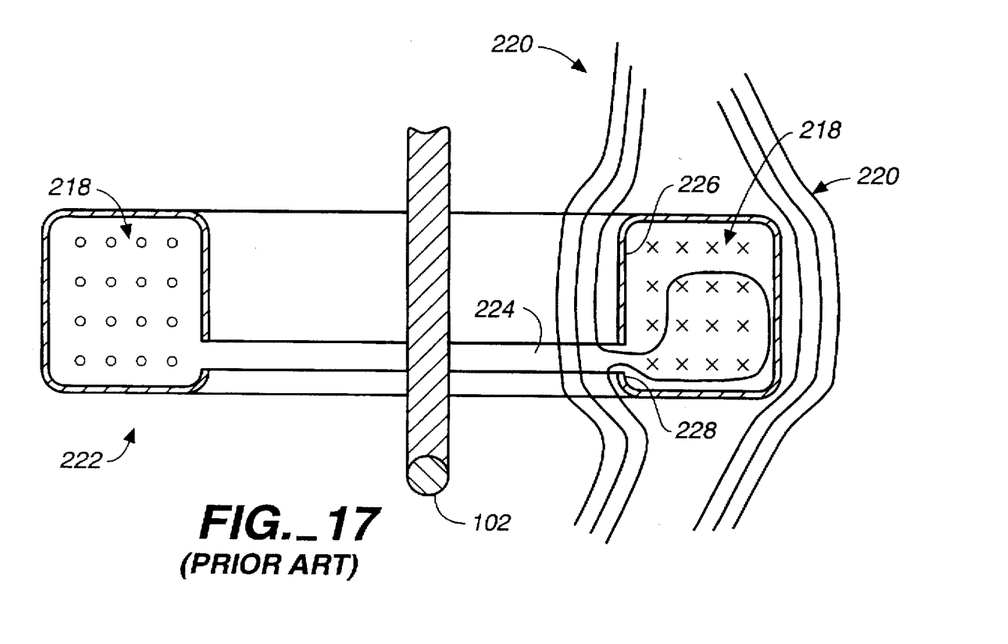
FIG. 17 shows penetration of stray magnetic flux through the conventional non-elongated gap of a prior art transformer shield.

In contrast, FIG. 17 shows a prior art transformer shield 222 with a conventional non-elongated gap. The inner end portions or walls 226 and 228 of transformer shield 222 which define the gap 224 do not overlap. As a result, stray magnetic flux 220, due to current in the conductor 102 being monitored that does not flow perpendicular to the side walls 214 and 216 of the transformer shield 222, can penetrate through the gap 224 into the area enclosed by the transformer shield 222. This occurs because the length of the gap 224 (i.e., the thickness of end walls 226 and 228) relative to its width (i.e., the distance between end walls 226 and 228) is small. This prevents enough currents from being induced in the end walls 226 and 228 which will create an opposing magnetic flux in the space around the gap 224 that will offset the stray magnetic flux 220 in this space.

Referring back to FIGS. 1 and 3, where the inner and outer conductors 120 and 124 of the coaxial cable 114 are respectively coupled to the signal terminal 106 and the conductive wire 115, the outer conductor 124 does not surround the inner conductor 120 so that shielding of the conductive output signal path ends. Where there is no shielding of the conductive output signal path, the conductive output and return signal paths, along with the resistor 178 and capacitor 180 of the compensation circuit 116, at least partially define and enclose a loop pickup area 230 through which magnetic flux can pass.

As shown in FIG. 4, the equivalent circuit includes a loop pickup area mutual inductance 232 which is effectively provided in the conductive output signal path as the mutual inductance of the loop pickup area 230 with the conductor 102. When rapidly changing circumferential magnetic flux or stray non-circumferential magnetic flux passes through the loop pickup area 230, a voltage spike is induced across the loop pickup area mutual inductance 232. This induced voltage spike is then seen as output signal overshoot across the output terminals 122 and 128.

However, referring again to FIG. 16, since transformer shield 104 has an elongated or deep insulating gap 212, the penetration of the stray non-circumferential magnetic flux 218 is reduced. Thus, the voltage spike induced across the loop pickup area mutual inductance 232 shown in FIG. 4 due to a rapid change in magnetic flux 218 through pickup loop area 230 is reduced which results in reduced output signal overshoot across output terminals 122 and 128.

In the case of the prior transformer shield 222 shown in FIG. 17, the penetration of the stray non-circumferential magnetic flux 220 is rather large since the end portions 226 and 228 that define the gap 224 do not overlap. Thus, if the prior art transformer shield were employed for the transformer 100 shown in FIG. 1, the voltage spike induced across the pickup loop mutual inductance 232 in FIG. 4 due to a rapid change in magnetic flux 220 through loop pickup area 230 would be large and result in significant output signal overshoot across the output terminals 122 and 128.

Although winding assembly 110 above was described as including a core 136, a winding 138, a resistive load 140, a planar conductor 142, and taps 144, the gap 212 just described can be used for other types of winding assemblies. Such winding assemblies might include simply a winding and no core or might include just a winding and a core.

Moreover, one skilled in the art will recognize that the conductive output and return signal paths may include the inner and outer conductors of a flexible coaxial cable or a semi-rigid coaxial cable, conductive wires, resistors, or other types of conductive elements and any combination thereof.

However, for purposes to be described shortly, in the preferred embodiment, the conductive output and return signal paths respectively include the inner copper conductor 120 and the tubular outer copper conductor 124 of a small-gauge semi-rigid coaxial cable 114, as shown in FIGS. 1 and 3. The coaxial cable 114 includes, in addition to the inner and outer conductors 120 and 124, a tubular insulator 234 between the inner and outer conductors 120 and 124. The tubular outer conductor 124 surrounds most of the inner conductor 120 except the end 130 (including the portion covered by the exposed end 236 of the insulator 234).

As shown in FIG. 3, the winding assembly has a space 238 between the ends 154 and 162 of the resistive load 140 and between the ends 156 and 158 of the planar conductor 142. The coaxial cable 114 extends into the space 238. Because the coaxial cable 114 has a small cross sectional area, the space 238 is made small so that the resistive load 140 and the planar conductor 142 traverse substantially most of the outer circumference 150 of the core 136.

The coaxial cable 114 may have a cross sectional diameter in the range of approximately 0.040–0.085 inches. In the preferred embodiment, this diameter is approximately 0.060 inches, the space 238 is approximately 0.40 inches, and the unshielded end 130 of the inner conductor 120 is approximately 0.12 inches long.

Since the coaxial cable 114 extends into the space 238, the ends 130 and 132 of the inner and outer conductors 120 and 124 can be respectively disposed proximate to the terminals 106 and 108 of the winding assembly 110 while being respectively coupled to them as well. Thus, the end 130 of inner conductor 120 can be directly connected to the terminal 106, as shown in FIG. 3, or can be proximately coupled to the terminal 106 by a resistor, a conductive wire, a coil, or other conductive element or circuit. Moreover, the end 132 of outer conductor 124 can be directly connected to the terminal 108, or can be proximately coupled to the terminal 108 by a conductive wire, as shown in FIG. 3, or a resistor, a coil, or other conductive element or circuit. Thus, since the distance of the conductive output and return signal paths from the ends 130 and 132 of the inner and outer conductors 120 and 124 to the terminals 106 and 108 respectively is reduced, the portion of the loop pickup area 230 between the conductive output and return signal paths is reduced.

Moreover, the small cross sectional area of the semi-rigid coaxial cable 114 makes the spacing between the inner and outer conductors 120 and 124 small. As a result, the inner conductor 120 of the conductive output signal path and the conductive wire 115 of the conductive return signal path are spaced adjacently to each other as are the terminals 106 and 108. Thus, the portion of the loop pickup area 230 between the conductive paths 146 and 148 is further reduced.

Furthermore, the capacitor 180 and the resistor 178 lie adjacent to and parallel to each other with the capacitor 180 being directly connected to and adjacent the terminal 106 and the resistor 178 being directly connected to and adjacent the terminal 108. As a result, the portion of the loop pickup area 230 between the resistor 178 and the capacitor 180 is reduced as well.

Since the loop pickup area 230 is reduced in the manner just described, the amount of both circumferential and non-circumferential stray magnetic flux that passes through the loop pickup area 230 is limited. Thus, the pickup loop area mutual inductance 232 and any associated voltage spike induced across the loop pickup area mutual inductance 232 due to a change in the magnetic flux through the loop pickup area 230 are both reduced. As a result, the output signal overshoot across the output terminals 122 and 128 due to the pickup loop area mutual inductance 232 is also reduced.

Referring back to FIG. 14, all of the inner walls or end portions 206 and 208, the outer wall or portion 210, and the side walls or portions 214 and 216 are spaced from the winding assembly 110. In other words, no portion of the transformer shield 104 is adjacent to the winding assembly 110. Moreover, the transformer shield 104 does not enclose another transformer shield that has any portion adjacent to the winding assembly 110.

In the preferred embodiment of transformer 100, the inner walls 206 and 208 are respectively spaced approximately 0.31 inches and 0.25 inches from the core 136 so that transformer 100 has approximately a two inch hole diameter in which the conductor 102 can be placed for monitoring by the transformer 100. Moreover, the outer wall 210 is spaced approximately 0.32 inches from the core 136 and the side walls 214 and 216 are each spaced approximately 0.32 inches from the core 136.

Since all of the transformer shield 104 is spaced apart from the winding assembly 110 and no other shield is enclosed by the transformer shield 104, stray capacitances between the transformer shield 104 and the core 136, the winding 138, the resistive load 140, and the planar conductor 142 are reduced. This flattens the frequency response of the transformer 100 and reduces ringing in the time domain of the output signal of the transformer 100 across the output terminals 122 and 128.

Moreover, because all of the transformer shield 104 is spaced apart from the winding assembly 110, the portion of the coaxial cable 114 enclosed by the transformer shield 104 can be disposed between the outer wall 210 of the transformer shield 104 and the resistive load 140, as shown in FIGS. 1 and 3.

As is evident form the foregoing discussion, transformer 100 is configured so that output signal overshoot and ringing is reduced. As a result, the useable rise time of a pulse output signal across the terminals 122 and 128 of the transformer 100 can be accurately monitored down to approximately 5 nanoseconds while alternating currents with frequencies above 100 megahertz can also be accurately monitored across terminals 122 and 128.

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is:

1. A current transformer for monitoring a current in a conductor, said current transformer comprising:

a pair of output terminals;

a winding assembly including a pair of winding assembly terminals, each of said winding assembly terminals being coupled to a corresponding one of said output terminals, said winding assembly also including a resistive load and a winding both coupled between said winding assembly terminals, said resistive load being along said winding and having a resistance and an intrinsic inductance effectively in series with said resistance, said winding assembly producing an output signal across said output terminals with a voltage generally proportional to said current in response to a changing magnetic flux that passes through said winding and is caused by changes in said current; and a compensation circuit coupled between said winding assembly terminals and having an impedance selected so as to reduce output signal overshoot across said output terminals caused by said intrinsic inductance in response to said changing magnetic flux.

2. A current transformer as recited in claim 1 wherein said circuit includes:

a resistor having a resistance; and a capacitor coupled in series with said resist or and having a capacitance;

said resistor's resistance and said capacitor's capacitance being selected so as to reduce said output signal overshoot across said output terminals.

3. A current transformer as recited in claim 1 further comprising a transformer shield enclosing said winding assembly and said circuit and shaped so as to allow penetration of said changing magnetic flux in said transformer shield.

4. A current transformer as recited in claim 1 wherein said impedance of said compensation circuit is selected by:

determining frequency and time domain responses of said resistive load in a test circuit in response to a current step applied across said resistive load;

modeling frequency and time domain responses of said resistive load in an equivalent circuit for said test circuit so as to match said determined frequency and time domain responses and determine in response model values for said resistance, said intrinsic inductance, and an intrinsic capacitance of said resistive load;

adding said compensation circuit to said equivalent circuit;

modeling frequency and time domain responses of said resistive load in said equivalent circuit with said compensation circuit and said determined model values for said resistance, said intrinsic inductance, and said intrinsic capacitance so as to determine one or more model values for said impedance for which said modeled frequency response of said resistive load is the flattest and said modeled time domain response of said resistive load shows the least output voltage overshoot; and selecting one or more actual values for said impedance from said determined one or more model values for said impedance.

5. A current transformer for monitoring a current in a conductor, said current transformer comprising:

a winding assembly including:
  a first winding assembly terminal;
  a second winding assembly terminal;
  a winding having a first end coupled to said first winding assembly terminal and a second end coupled to said second winding assembly terminal; and
  a resistive load along said winding and having a first end coupled to said first winding assembly terminal, a second end coupled to said second winding assembly terminal, a resistance, and an intrinsic inductance effectively in series with said resistance;

a first output terminal coupled to said first winding assembly terminal;

a second output terminal coupled to said second winding assembly terminal;

said winding assembly producing an output signal with a voltage generally proportional to said current across said first and second output terminals in response to a changing magnetic flux that passes through said winding and is caused by changes in said current;

a compensation circuit coupled between said first and second winding assembly terminals having an impedance selected to reduce output signal overshoot across said output terminals caused by said intrinsic inductance in response to said changing magnetic flux; and a transformer shield enclosing said winding assembly and said compensation circuit and shaped so as to allow penetration of said changing magnetic flux in said transformer shield.

6. A current transformer as recited in claim 5 wherein all of said transformer shield is spaced from said winding assembly and does not enclose another transformer shield such that stray capacitances between said transformer shield and said winding assembly are reduced so as to flatten said transformer's frequency response and reduce ringing in said output signal.

7. A current transformer as recited in claim 5 further comprising:

a first conductive path that connects said first winding assembly terminal and said first output terminal;

a second conductive path that connects said second winding assembly terminal and said second output terminal;

said first and second conductive paths and said compensation circuit at least partially enclosing a loop pickup area;

said first and second winding assembly terminals being adjacent to each other;

a small gauge semi-rigid coaxial cable including:
  an inner conductor included in said first conductive path and having a first end coupled to said first winding assembly terminal and a second end coupled to said first output terminal;
  an outer conductor included in second conductive path and having a first end coupled to said second winding assembly terminal and a second end coupled to said second output terminal; and
  an insulator between said inner and said outer conductors;

said small gauge semi-rigid coaxial cable having a portion including said first ends of said inner and outer conductors that is enclosed by said transformer shield, said small gauge semi-rigid coaxial cable having a small cross section so that said first ends of said inner and outer conductors are respectively proximate to said first and second winding assembly terminals and so that spacing between said inner and outer conductors is small whereby said loop pickup area is reduced so as to reduce output signal overshoot across said output terminals that is caused by a loop pickup area mutual inductance with said monitored conductor in response to said changing magnetic flux passing through said loop pickup loop area.

8. A current transformer as recited in claim 5 wherein said impedance of said circuit is selected by:

determining frequency and time domain responses of said resistive load in a test circuit in response to a current step applied across said resistive load;

modeling frequency and time domain responses of said resistive load in an equivalent circuit for said test circuit so as to match said determined frequency and time domain responses and determine in response model values for said resistance, said intrinsic inductance, and an intrinsic capacitance of said resistive load;

adding said compensation circuit to said equivalent circuit;

modeling frequency and time domain responses of said resistive load in said equivalent circuit with said compensation circuit and said determined model values for said resistance, said intrinsic inductance, and said intrinsic capacitance so as to determine one or more model values for said impedance for which said modeled frequency response of said resistive load is the flattest and said modeled time domain response of said resistive load shows the least output voltage overshoot; and selecting one or more actual values for said impedance from said determined one or more model values for said impedance.

9. A current transformer as recited in claim 5 wherein said compensation circuit includes:

a resistor having a resistance; and a capacitor coupled in series with said resistor and having a capacitance;

said resistor's resistance and said capacitor's capacitance being selected so as to reduce said output signal overshoot across said output terminals.

10. A method of selecting an impedance for a compensation circuit in a current transformer that is used to monitor a current in a conductor, said current transformer including a pair of output terminals and a winding assembly, said winding assembly including a pair of winding assembly terminals, each of said winding assembly terminals being coupled to a corresponding one of said output terminals, said winding assembly also including a resistive load and a winding both coupled between said winding assembly terminals, said resistive load being along said winding and having a resistance, an intrinsic inductance effectively in series with said resistance, and an intrinsic capacitance effectively in parallel with said resistance and said intrinsic inductance, said winding assembly producing an output signal across said output terminals with a voltage generally proportional to said current in response to a changing magnetic flux that passes through said winding and is caused by changes in said current, said compensation circuit being coupled between said winding assembly terminals so that said impedance of said compensation circuit reduces output signal overshoot across said output terminals caused by said intrinsic inductance in response to said changing magnetic flux, said method comprising the steps of:

determining frequency and time domain responses of said resistive load in a test circuit in response to a current step applied across said resistive load;

modeling frequency and time domain responses of said resistive load in an equivalent circuit for said test circuit so as to match said determined frequency and time domain responses and determine in response model values for said resistance, said intrinsic inductance, and said intrinsic capacitance;

adding said compensation circuit to said equivalent circuit;

modeling frequency and time domain responses of said resistive load in said equivalent circuit with said compensation circuit and said determined model values for said resistance, said intrinsic inductance, and said intrinsic capacitance so as to determine one or more model values for said impedance for which said modeled frequency response of said resistive load is the flattest and said modeled time domain response of said resistive load shows the least output voltage overshoot; and selecting one or more actual values for said impedance from said determined one or more model values for said impedance.

11. A method as recited in claim 10 wherein:

said compensation circuit includes a resistor with a compensation resistance and a capacitor with a compensation capacitance;

said one or more model values include a model value for said compensation resistance and a model value for said compensation capacitance;

said one or more actual values include an actual value for said compensation resistance and an actual value for said compensation capacitance.

* * * * *